(12) United States Patent
Terasawa et al.

(10) Patent No.: US 10,605,869 B2
(45) Date of Patent: Mar. 31, 2020

(54) BATTERY VOLTAGE DETECTOR

(71) Applicant: SANKEN ELECTRIC CO., LTD., Niiza-Shi, Saitama (JP)

(72) Inventors: Youichi Terasawa, Tokyo (JP); Akira Ichinose, Fujimi (JP); Takashi Kawaguchi, Fujimi (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 362 days.

(21) Appl. No.: 15/815,891

(22) Filed: Nov. 17, 2017

(65) Prior Publication Data
US 2019/0154759 A1    May 23, 2019

(51) Int. Cl.
G01R 31/36       (2020.01)
G01R 19/165      (2006.01)
G01R 31/3835     (2019.01)
G01R 31/396      (2019.01)
G01R 31/40       (2020.01)
G01R 15/04       (2006.01)
H01M 10/00       (2006.01)
H02J 7/00        (2006.01)
G01R 19/00       (2006.01)
G01R 19/10       (2006.01)
G01R 17/00       (2006.01)

(52) U.S. Cl.
CPC ......... *G01R 31/3835* (2019.01); *G01R 15/04* (2013.01); *G01R 19/16519* (2013.01); *G01R 31/396* (2019.01); *G01R 31/40* (2013.01); *H01M 10/00* (2013.01); *G01R 17/00* (2013.01); *G01R 19/0084* (2013.01); *G01R 19/10* (2013.01); *G01R 19/16542* (2013.01); *H02J 7/0021* (2013.01)

(58) Field of Classification Search
CPC .... G01R 15/04; G01R 17/00; G01R 19/0084; G01R 19/10; G01R 19/16519; G01R 19/16542; G01R 31/3835; G01R 31/396; G01R 31/40; H01M 10/00; H01M 10/48; H02J 7/0021
USPC .............. 702/61, 63; 320/118, 134; 324/434
See application file for complete search history.

(56) References Cited

U.S. PATENT DOCUMENTS 5,825,155 A * 10/1998 Ito .................... G01R 19/16542
                                                       320/118
9,366,730 B2 * 6/2016 Sano .................... G01R 31/396

FOREIGN PATENT DOCUMENTS

JP            4169173 B2    10/2008

* cited by examiner

*Primary Examiner* — John H Le
(74) *Attorney, Agent, or Firm* — Metrolex IP Law Group, PLLC

(57) ABSTRACT

Voltage-dividing resistors are arranged in parallel with a first DC power supply. A first switch is electrically connected to a first resistor and a second resistor and includes a first terminal, a second terminal, and a control terminal. A second switch switches supply of a power voltage from a second DC power supply. A voltage comparator includes a first and a second input terminals. A reference power supply is connected to the first input terminal of the voltage comparator and outputs a reference voltage. The first terminal of the first switch is electrically connected to the second input terminal of the voltage comparator. The control terminal of the first switch is electrically connected to a positive voltage side of the second DC power supply. When the power voltage is supplied to the control terminal, and allows a voltage to be applied to the first and the second resistors.

9 Claims, 1 Drawing Sheet

BATTERY VOLTAGE DETECTOR

BACKGROUND

The disclosure is generally related to a battery voltage detector, and specifically to a battery voltage detector detecting an output of a connectable DC (Direct Current) power supply.

Japanese Patent No. 4169173 (prior art document 1) discloses a voltage detection circuit that is connected via a switch when the output voltage becomes higher than a reference voltage, and detects an overvoltage with a comparator using voltage-dividing resistors. In this voltage detection circuit, a DC-DC converter 10 converts DC input voltage Vin into DC voltage V0 having a different voltage value, and supplies it to output terminals 8 and 9. A control circuit 11 controls the DC-DC converter 10. An overvoltage protection circuit 12 detects DC output voltage V0 supplied to the output terminals 8 and 9 to generate voltage detection signal V1, also compares voltage detection signal V1 and reference voltage signal Vr1 to generate overvoltage detection signal V2, and supplies overvoltage detection signal V2 to the control circuit 11. A switch unit 2B, operating simultaneously with a power-on switch 2A, opens and closes an electrical circuit formed between the output side of the DC-DC converter 10 and the overvoltage protection circuit 12.

SUMMARY

A battery voltage detector according to one or more embodiments that detects an output voltage of a connectable first DC power supply, includes: voltage-dividing resistors that are arranged in parallel with the first DC power supply and include at least a first resistor and a second resistor; a first switch that is electrically connected to the first resistor and the second resistor and includes a first terminal, a second terminal, and a control terminal; a second DC power supply that supplies a power voltage; a second switch that switches supply of the power voltage; a voltage comparator that includes a first and a second input terminals; and a reference power supply that is connected to the first input terminal of the voltage comparator and outputs a reference voltage, wherein the first terminal of the first switch is electrically connected to the second input terminal of the voltage comparator, the control terminal of the first switch is electrically connected to a positive voltage side of the second DC power supply directly or via a resistor, and when the power voltage is supplied to the control terminal, the first switch turns on and allows a voltage to be applied to the first and the second resistors.

A battery voltage detector according to one or more alternative or additional embodiments that detects an output voltage of a connectable first DC power supply, includes: voltage-dividing resistors that include at least a first resistor and a second resistor and divide the output voltage of the first DC power supply; a first switch that is electrically connected to the first resistor and the second resistor and includes a first terminal, a second terminal, and a control terminal; a second DC power supply that supplies a power voltage; a second switch that switches supply of the power voltage; a voltage comparator that includes a first and a second input terminals; a timer latch circuit electrically connected to the control terminal of the first switch that outputs a switching detection signal; a reference power supply that is connected to the first input terminal of the voltage comparator and outputs a reference voltage; and a third switch that is electrically connected to the control terminal of the first switch and an output of the timer latch circuit that controls an input of the first switch based on the switching detection signal, wherein the first terminal of the first switch is electrically connected to the second input terminal of the voltage comparator, the control terminal of the first switch is electrically connected to a positive voltage side of the second DC power supply directly or via a resistor, and when the second DC power supply is supplied to the control terminal and when the third switch turns off, the first switch turns on and allows a voltage to be applied to the first and the second resistors.

Those skilled in the art will recognize additional features and advantages upon reading the following detailed description, and upon viewing the accompanying drawings.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
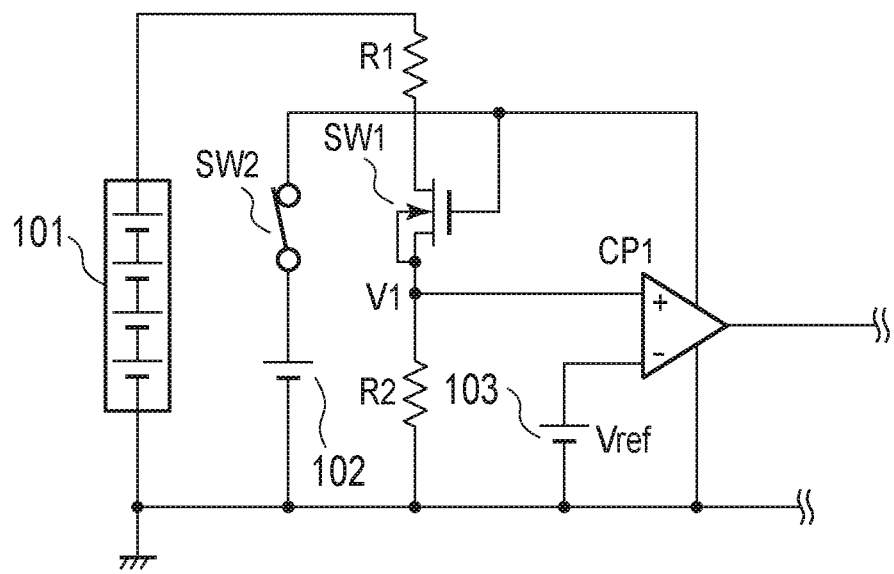
FIG. 1 is a diagram illustrating a battery voltage detector according to one or more embodiments.

Embodiments are described with reference to drawings, in which the same constituents are designated by the same reference numerals and duplicate explanation concerning the same constituents may be omitted for brevity and ease of explanation. The drawings are illustrative and exemplary in nature and provided to facilitate understanding of the illustrated embodiments and may not be exhaustive or limiting. Dimensions or proportions in the drawings are not intended to impose restrictions on the disclosed embodiments. For this reason, specific dimensions and the like should be interpreted with the accompanying descriptions taken into consideration. In addition, the drawings include parts whose dimensional relationship and ratios are different from one drawing to another.

Prepositions, such as "on", "over" and "above" may be defined with respect to a surface, for example a layer surface, regardless of the orientation of the surface in space.

FIG. 1 illustrates a battery voltage detector according to one or more embodiments. The battery voltage detector includes: a first resistor R1 and a second resistor R2 that are electrically connected to a battery 101; a first switch SW1 electrically connected between the first resistor R1 and the second resistor R2; a circuit power switch SW2 that performs switching to turn on a voltage of a circuit power supply 102; and a comparator CP1 into which a reference voltage outputted by a voltage source 103 and the voltage at between the detection resistors R1 and R2 are inputted and which compares these voltages and outputs a comparison signal. The battery 101, the circuit power supply 102, and the voltage source 103 may be detachable from the battery voltage detector.

The detection resistors R1 and R2 divide the voltage to be measured, for example, the voltage of the battery 101. The detection resistors R1 and R2 may be voltage-dividing resistors. In this implementation example, the detection resistors R1 and R2 are connected in parallel with the battery 101. The circuit power switch SW2 turns on the circuit power supply to supply it to the battery voltage detector. The first switch SW1 in FIG. 1 is connected between the first resistor R1 and the second resistor R2, and the gate of the first switch SW1 is connected to the circuit power switch SW2. The drain of the first switch SW1 is connected to the detection resistor R1. The source of the first switch SW1 is connected to a first input terminal of the comparator CP1. The source of the first switch SW1 is also connected to the detection resistor R2. Switching on the circuit power switch SW2 applies the voltage of the circuit power supply 102 to the gate of the first switch SW1. This enables the first switch SW1 to operate. Here, the first switch SW1 may be a MOS transistor, an N-type MOS transistor, or an N-type FET (Field Effect Transistor).

In the battery voltage detector illustrated in FIG. 1, when the circuit power switch SW2 is turned on, the voltage of the circuit power supply 102 is supplied to the battery voltage detector and applied to the gate of the first switch SW1. Then, the voltage of the battery 101 is substantially divided and applied to the first resistor R1 and the second resistor R2. The electric potential at the source of the circuit power switch SW2 is a first voltage V1 applied to the detection resistor R2. The comparator compares the first voltage V1 with the reference voltage Vref and outputs the comparison signal. When the voltage of the battery 101 becomes lower than or equal to a predetermined voltage and the first voltage V1 becomes lower than or equal to the reference voltage Vref, the comparator switches the comparison signal and outputs it.

The first voltage V1 is a divided voltage of the battery 101, and may be a voltage close to the reference voltage Vref, which is a relatively low voltage. This first voltage V1 may be determined by the detection resistor R1, the detection resistor R2, and the battery 101. For example, if the detection resistor R1 has a relatively large resistance value, and the detection resistor R2 has a relatively small resistance value, the first voltage V1 can be a relatively low voltage. Even if the voltage to be detected is higher than the power voltage of the control circuit, it is possible to detect the battery voltage.

Typically, the switch is connected to the positive output voltage. In the case where, for example, an N-type MOS switch is used as the switch, the switch needs to be saturated, so that a bootstrap power supply or the like is necessary for making the gate voltage higher than the output voltage. This requires at least a diode and a capacitor for the bootstrap. The implementation example can be implemented without adding these parts.

Next, the circuit power switch SW2 turns off, which stops application of the voltage to the gate of the first switch. When the first switch SW1 turns off, the detection resistor R1 and the detection resistor R2 are disconnected, which allows for the reduction of the power consumption of the battery 101.

As described above, inserting the first switch SW1 into a line to which the first resistor R1 and the second resistor R2 are connected makes the electric potential at the source of the first switch SW1 a low voltage via the detection resistor R2. This makes it possible to obtain a driving power for the gate terminal of the first switch SW1.

Additionally, even if the voltage of the circuit power supply is set to be higher than the reference voltage Vref, it is possible to detect the battery voltage without the influence of the first switch SW1 once the first switch SW1 turns on.

Moreover, since the voltage higher than that of the circuit power supply 102 is not required, a bootstrap circuit is not necessary, for example.

In addition, when the voltage of the circuit power supply 102 is higher than a voltage obtained by adding the first voltage V1 and the reference voltage Vref, the first switch SW1 is turned on. By this, it is possible to detect the battery voltage without the influence of the first switch SW1 once the first switch SW1 turns on.

In addition, even when the voltage of the battery 101 increases, the source voltage of the first switch SW1 increases, and an on-state of the gate voltage cannot be kept, the source voltage of the first switch SW1 is balanced at the power voltage of the comparator CP1−the reference voltage Vref. Thus, it is not necessary to use a clamp circuit that clamps the source voltage of the first switch SW1 such as a Zener diode or the like for the implementation.

Figure 2:
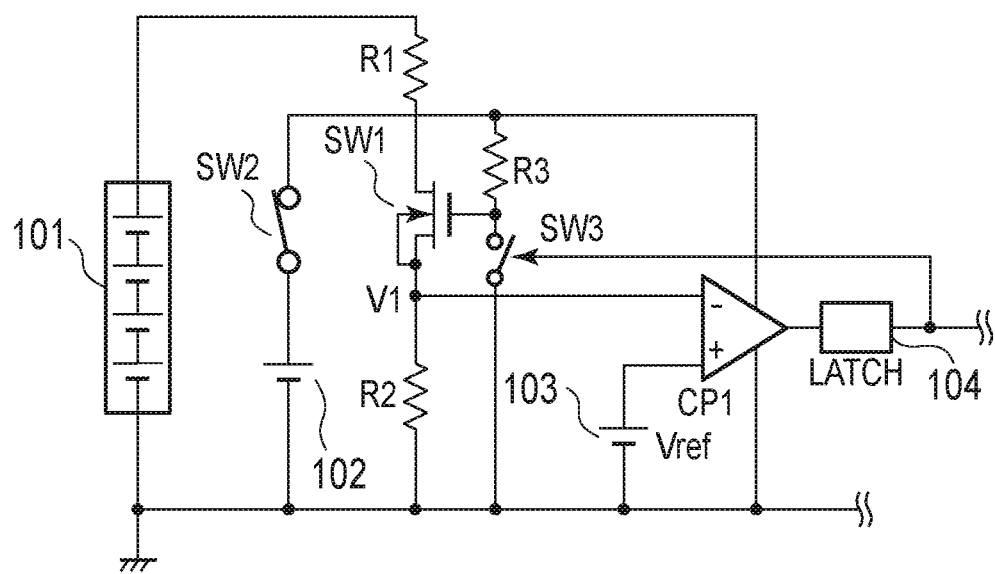
FIG. 2 is a diagram illustrating a battery voltage detector according to one or more alternative or additional embodiments.

FIG. 2 illustrates a battery voltage detector according to one or more alternative or additional embodiments. The battery voltage detector illustrated in FIG. 2 includes: a first resistor R1 and a second resistor R2 that are electrically connected to a battery 101; a first switch SW1 electrically connected between the first resistor R1 and the second resistor R2; a circuit power switch SW2 that performs switching to turn on a voltage of a circuit power supply 102; a comparator CP1 into which a reference voltage Vref outputted by a voltage source 103 and the voltage at between the detection resistors R1 and R2 are inputted and which compares these voltages and outputs a comparison signal; a timer latch circuit 104 into which the output of the comparator CP1 is inputted and which performs predetermined processing on the input and outputs it to a switch SW3; the switch SW3 that is connected to the gate of the first switch SW1 and performs switching in accordance with the output of the timer latch circuit 104; and a third resistor R3 connected to the gate of the first switch SW1. The battery 101, the circuit power supply 102, and the voltage source 103 may be detachable from the battery voltage detector.

The detection resistors R1 and R2 divide the voltage to be measured, for example, the voltage of the battery 101. In this implementation example, the detection resistors R1 and R2 are connected in parallel with the battery 101. The circuit power switch SW2 turns on the circuit power supply to supply it to the battery voltage detector. The first switch SW1 in FIG. 1 is connected between the first resistor R1 and the second resistor R2, and the gate of the first switch SW1 is connected to the circuit power switch SW2. The drain of the first switch SW1 is connected to the detection resistor R1. The source of the first switch SW1 is connected to a first input terminal of the comparator CP1. The source of the first switch SW1 is also connected to the detection resistor R2. Switching of the circuit power switch SW2 applies the voltage of the circuit power supply 102 to the gate of the first switch SW1. This enables the first switch SW1 to operate. The first switch SW1 may be a MOS transistor or an N-type MOS transistor.

In the battery voltage detector illustrated in FIG. 2, when the circuit power switch SW2 is turned on, the voltage of the circuit power supply 102 is supplied to the battery voltage detector and applied to the gate of the first switch SW1. Then, the voltage of the battery 101 is substantially divided and applied to the first resistor R1 and the second resistor R2. The electric potential at the source of the circuit power switch SW2 is a first voltage V1 applied to the detection resistor R2. The comparator compares the first voltage V1 with the reference voltage Vref and outputs the comparison signal. When the voltage of the battery 101 becomes lower than or equal to a predetermined voltage and the first voltage V1 becomes lower than or equal to the reference voltage Vref, the comparator switches the comparison signal and outputs it. The timer latch circuit 104 detects the output signal of the comparison signal and outputs a switching detection signal to the switch SW3 after predetermined period of time. The timer latch circuit 104 alleviates malfunction caused by noise or timing issue of the battery voltage detector. When the switch SW3 turns on, application of the voltage to the gate of the first switch SW1 stops. When the first switch SW1 turns off, the detection resistor R1 and the detection resistor R2 are disconnected, which allows for the reduction of the power consumption of the battery 101.

The first voltage V1 is a divided voltage of the battery 101, and may be a voltage close to the reference voltage Vref, which is a relatively low voltage. This first voltage V1 may be determined by the detection resistor R1, the detection resistor R2, and the battery 101. For example, if the detection resistor R1 has a relatively large resistance value, and the detection resistor R2 has a relatively small resistance value, the first voltage V1 can be a relatively low voltage. Even if the battery voltage to be detected is higher than the power voltage of the control circuit, it is possible to detect the battery voltage.

Typically, the switch is connected to the positive output voltage. In the case where, for example, an N-type MOS switch is used as the switch, the switch needs to be saturated, so that a bootstrap power supply or the like is necessary for making the gate voltage higher than the output voltage. This requires at least a diode and a capacitor for the bootstrap. The implementation example can be implemented without adding these parts.

Next, the circuit power switch SW2 turns off, which stops application of the voltage to the gate of the first switch SW1. When the first switch SW1 turns off, the detection resistor R1 and the detection resistor R2 are disconnected, which allows for the reduction of the power consumption of the battery 101.

As described above, inserting the first switch SW1 into a line to which the first resistor R1 and the second resistor R2 are connected makes the electric potential at the source of the first switch SW1 a low voltage via the detection resistor R2. This makes it possible to obtain a driving power voltage for the gate terminal of the first switch SW1.

Additionally, even if the voltage of the circuit power supply is set to be higher than the reference voltage Vref, it is possible to detect the battery voltage without the influence of the switch SW1 once the first switch SW1 turns on. Moreover, since the voltage higher than that of the circuit power supply 102 is not required, a bootstrap circuit is not necessary, for example.

Further, in the embodiments in FIG. 2, the switch SW3 is switched in accordance with the output of the comparator CP1. The switch SW3 switches application of the voltage to the gate of the switch SW1, and disconnects the detection resistor R1 and the detection resistor R2 from each other. This allows for the reduction of the power consumption of the battery 101 while the battery 101 is connected with the battery voltage detector.

In the prior art document 1, the switch is connected to the positive output voltage, and in the case where, for example, a N-type MOS switch is used as the switch, the switch needs to be saturated, so that a bootstrap power supply or the like is necessary for making the gate voltage higher than the output voltage. This requires at least a diode and a capacitor for the bootstrap.

If a P-type MOS switch is used, the same voltage as the battery voltage needs to be applied to the gate of the switch in order to turn it off. Thus, controlling this voltage requires at least another device with a withstand voltage higher than or equal to the battery.

The embodiments described above can be implemented with minimum additional circuitry, even if the voltage of the battery 101 is higher than voltages used in the battery power supply detection circuit. The embodiments also allow for the reduction of the power consumption.

The above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:

1. A battery voltage detector that detects an output voltage of a connectable first DC power supply, comprising:
   voltage-dividing resistors that are arranged in parallel with the first DC power supply and include at least a first resistor and a second resistor;
   a first switch that is electrically connected to the first resistor and the second resistor and includes a first terminal, a second terminal, and a control terminal;
   a second DC power supply that supplies a power voltage;
   a second switch that switches supply of the power voltage;
   a voltage comparator that includes a first and a second input terminals; and
   a reference power supply that is electrically connected to the first input terminal of the voltage comparator and outputs a reference voltage, wherein
   the first terminal of the first switch is electrically connected to the second input terminal of the voltage comparator,
   the control terminal of the first switch is electrically connected to a positive voltage side of the second DC power supply directly or via a resistor, and
   when the power voltage is supplied to the control terminal, the first switch turns on and allows a voltage to be applied to the first and the second resistors.

2. The battery voltage detector according to claim 1, further comprising
   a second switch that switches supply of the power voltage, wherein
   the control terminal of the first switch is electrically connected to a positive voltage side of the second DC power supply via the second switch.

3. The battery voltage detector according to claim 2, wherein
   in the detection circuit, at least the first and the second switches, the voltage comparator, and the reference power supply are included in an integrated circuit.

4. The battery voltage detector according to claim 2, wherein
   the first switch includes a N-type FET.

5. A battery voltage detector that detects an output voltage of a connectable first DC power supply, comprising:

voltage-dividing resistors that include at least a first resistor and a second resistor and divide the output voltage of the first DC power supply;

a first switch that is electrically connected to the first resistor and the second resistor and includes a first terminal, a second terminal, and a control terminal;

a second DC power supply that supplies a power voltage;

a second switch that switches supply of the power voltage;

a voltage comparator that includes a first and a second input terminals;

a timer latch circuit electrically connected to the control terminal of the first switch that outputs a switching detection signal;

a reference power supply that is electrically connected to the first input terminal of the voltage comparator and outputs a reference voltage; and a third switch that is electrically connected to the control terminal of the first switch and an output of the timer latch circuit that controls an input of the first switch based on the switching detection signal, wherein the first terminal of the first switch is electrically connected to the second input terminal of the voltage comparator, the control terminal of the first switch is electrically connected to a positive voltage side of the second DC power supply directly or via a resistor, and when the second DC power supply is supplied to the control terminal and when the third switch turns off, the first switch turns on and allows a voltage to be applied to the first and the second resistors.

6. The battery voltage detector according to claim 5, wherein the control terminal of the first switch is electrically connected to a positive voltage side of the second DC power supply via the second switch.

7. The battery voltage detector according to claim 6, wherein in the detection circuit, at least the first and the second switches, the voltage comparator, and the reference power supply are included in an integrated circuit.

8. The battery voltage detector according to claim 6, wherein the first switch includes a N-type FET.

9. The battery voltage detector according to claim 6, wherein the timer latch circuit receives an output signal of the comparison signal and outputs the switching detection signal after predetermined period of time.

* * * * *